United States Patent
Lee et al.

(10) Patent No.: US 8,547,724 B2
(45) Date of Patent: Oct. 1, 2013

(54) NONVOLATILE MEMORY DEVICE COMPRISING ONE-TIME-PROGRAMMABLE LOCK BIT REGISTER

(75) Inventors: Yong-Jun Lee, Hwaseong-si (KR); Kwang Jin Lee, Hwaseong-si (KR); Joon Min Park, Seoul (KR); Huik Won Seo, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 267 days.

(21) Appl. No.: 13/032,848

(22) Filed: Feb. 23, 2011

(65) Prior Publication Data
US 2011/0222330 A1      Sep. 15, 2011

(30) Foreign Application Priority Data

Mar. 11, 2010   (KR) .................. 10-2010-0021897

(51) Int. Cl.
   *G11C 17/00*      (2006.01)
(52) U.S. Cl.
   USPC ........................................... 365/100
(58) Field of Classification Search
   USPC ........................................... 365/100
   See application file for complete search history.

(56) References Cited

U.S. PATENT DOCUMENTS

| | | | |
|---|---|---|---|
| 6,226,199 B1 | 5/2001 | Ichikawa | |
| 6,266,271 B1 * | 7/2001 | Kawamura | ............... 365/185.04 |
| 6,421,799 B1 | 7/2002 | Ferrant | |
| 6,446,177 B1 | 9/2002 | Tanaka et al. | |
| 6,462,985 B2 | 10/2002 | Hosono et al. | |
| 6,480,438 B1 | 11/2002 | Park | |
| 6,487,113 B1 | 11/2002 | Park et al. | |
| 7,085,158 B2 * | 8/2006 | Jeon et al. | ................ 365/185.04 |
| 7,130,209 B2 | 10/2006 | Reggiori et al. | |
| 7,457,152 B2 * | 11/2008 | Lee et al. | ....................... 365/163 |
| 7,574,576 B2 * | 8/2009 | Kato et al. | ..................... 711/163 |
| 8,392,683 B1 * | 3/2013 | Confalonieri | ................. 711/163 |
| 2005/0013162 A1 | 1/2005 | Jeon et al. | |
| 2005/0177679 A1 | 8/2005 | Alva et al. | |
| 2005/0268086 A1 | 12/2005 | Kim | |
| 2011/0182101 A1 * | 7/2011 | Bae | ................ 365/94 |

FOREIGN PATENT DOCUMENTS

| | | |
|---|---|---|
| JP | 06-119791 | 4/1994 |
| JP | 2001035169 A | 2/2001 |
| JP | 2001035176 A | 2/2001 |
| JP | 2002-269988 | 9/2002 |
| JP | 2004152413 | 5/2004 |
| JP | 2007164971 A | 6/2007 |
| KR | 1020000028803 A | 5/2000 |

(Continued)

OTHER PUBLICATIONS

Notice to File a Response/Amendment to the Examination Report; Notice No. 9-5-2006-066742366; Korean Intellectual Property Office; Nov. 14, 2006.

*Primary Examiner* — Hoai V Ho
*Assistant Examiner* — Pablo Huerta
(74) *Attorney, Agent, or Firm* — Volentine & Whitt, PLLC

(57) ABSTRACT

A nonvolatile memory device comprises a one-time-programmable (OTP) lock bit register. The nonvolatile memory device comprises a variable-resistance memory cell array comprising an OTP block that store data and a register that stores OTP lock state information indicating whether the data is changeable. The register comprises a variable memory cell. An initial value of the OTP lock state information is set to a program protection state.

11 Claims, 12 Drawing Sheets

(56) References Cited

FOREIGN PATENT DOCUMENTS

| | | | |
|---|---|---|---|
| KR | 1020010015192 A | 2/2001 |
| KR | 1020050008225 A | 1/2005 |
| KR | 1020050046520 A | 5/2005 |
| KR | 1020070063276 A | 6/2007 |

* cited by examiner

NONVOLATILE MEMORY DEVICE COMPRISING ONE-TIME-PROGRAMMABLE LOCK BIT REGISTER

CROSS-REFERENCE TO RELATED APPLICATIONS

This U.S. non-provisional patent application claims priority under 35 U.S.C. §119 of Korean Patent Application No. 10-2010-0021897, filed on Mar. 11, 2010, in the Korean Intellectual Property Office (KIPO), the entirety of which is incorporated herein by reference.

BACKGROUND OF THE INVENTION

Embodiments of the inventive concept relate generally to semiconductor memory devices. More particularly, embodiments of the inventive concept relate to nonvolatile memory devices comprising a one-time-programmable lock bit register.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power.

Examples of volatile memory devices include static random access memory (SRAM), dynamic random access memory (DRAM), and synchronous DRAM (SDRAM). Examples of nonvolatile memory devices include read only memory (ROM), programmable ROM (PROM), electrically programmable ROM (EPROM), electrically erasable PROM (EEPROM), flash memory, phase-change random access memory (PRAM), magnetic random access memory (MRAM), resistive random access memory (RRAM), and ferroelectric random access memory (FRAM).

Among nonvolatile memory devices, flash memory has achieved increasing popularity in recent years due to a variety of attractive features, such as relatively high storage capacity and performance, and relatively low power consumption and cost. Recently, however, PRAM has been proposed as a potential alternative to flash memory. PRAM, also known as an Ovonic Unified Memory (OUM), is a type of variable-resistance memory.

A PRAM typically comprises a one-time-programmable (OTP) block that stores security data such as a serial number, information regarding a vendor, and a date of manufacture. The security data is sensitive information and must be secured against external interference such as unwanted tampering or reprogramming. However, unlike many flash memory devices, conventional PRAMs do not have a specific memory block designed for one time programming and subsequent data protection. As a result, security data stored in an OTP block of a conventional PRAM may be vulnerable to external interference.

SUMMARY OF THE INVENTION

Embodiments of the inventive concept provide nonvolatile memory devices comprising an OTP lock bit register for protecting an OTP memory against unauthorized data manipulation. Embodiments of the inventive concept also provide electronic systems incorporating such nonvolatile memory devices.

According to one embodiment of the inventive concept, a nonvolatile memory device comprises a variable-resistance memory cell array comprising a memory block that stores protected data, and a register that stores lock state information indicating whether the protected data is changeable, wherein the register comprises a variable-resistance memory cell and an initial value of the lock state information is set to a program protection state.

In certain embodiments, the nonvolatile memory device further comprises a mode controller that changes the protected data stored in the memory block in response to the lock state information.

In certain embodiments, the mode controller causes the register to store program unprotection information in response to a hidden code received from an external source.

In certain embodiments, the nonvolatile memory device further comprises an address decoder that selects the memory block, wherein the mode controller causes the address decoder select the memory block where the register stores program unprotection information.

In certain embodiments, the nonvolatile memory device further comprises a write driver that programs the memory block, wherein the mode controller causes the write driver to program the memory block where the register stores program unprotection information.

In certain embodiments, the lock state information comprises program protection information or program unprotection information.

In certain embodiments, the variable-resistance memory cell array comprises phase-change memory cells.

In certain embodiments, the variable-resistance memory cell comprises a phase-change memory cell and the program protection state corresponds to an amorphous state of a phase-change material in the phase-change memory cell.

According to another embodiment of the inventive concept, a nonvolatile memory device comprises a variable-resistance memory cell array comprising an OTP block that stores protected data, and a register that stores OTP lock state information indicating whether the protected data is changeable, wherein the register comprises by an E-fuse device and an initial value of the OTP lock state information is set to a program unprotection state.

In certain embodiments, the nonvolatile memory device further comprises an OTP mode controller that changes the protected data stored in the OTP block in response to the OTP lock state information.

In certain embodiments, the OTP mode controller causes the register to store program protection information in response to a command from an external source.

In certain embodiments, the nonvolatile memory device further comprises an address decoder that selects the OTP block, wherein the OTP mode controller causes the address decoder to select the OTP block where the register stores the program unprotection information.

In certain embodiments, the nonvolatile memory device further comprises a write driver that programs the OTP block, wherein the OTP mode controller causes the write driver to program the OTP block where the register stores the program unprotection information.

In certain embodiments, the OTP lock state information comprises program protection information or program unprotection information.

In certain embodiments, the variable-resistance memory cell array comprises phase-change memory cells.

According to another embodiment of the inventive concept, a method is provided for operating a nonvolatile memory device comprising a variable-resistance memory cell array comprising a memory block that stores protected data, and a variable-resistance memory cell that stores lock state information indicating whether the protected data is changeable. The method comprises initializing the variable-resistance memory cell to a program protection state, receiving a security code, in response to the security code, changing the variable-resistance memory cell to a program unprotection state, and while the variable-resistance memory cell is in the program unprotection state, programming the memory block. The method further comprises receiving a data protection command, and in response to the protection command, changing the variable-resistance memory cell to the program protection state.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In general, embodiments of the inventive concept relate to nonvolatile memory devices comprising an OTP block. The OTP block is a memory block that can be used to store security data regarding the nonvolatile memory device, such as a serial number and a date of manufacture.

The OTP block has a similar structure to other memory blocks that can be read and written multiple times. However, to prevent damage and leakage of the security data, the OTP block is prevented from being written more than once. To determine whether the OTP block has been written once, some nonvolatile memory devices perform a read operation on the OTP block. However, such a read operation can degrade the performance of the nonvolatile memory device.

Figure 1:
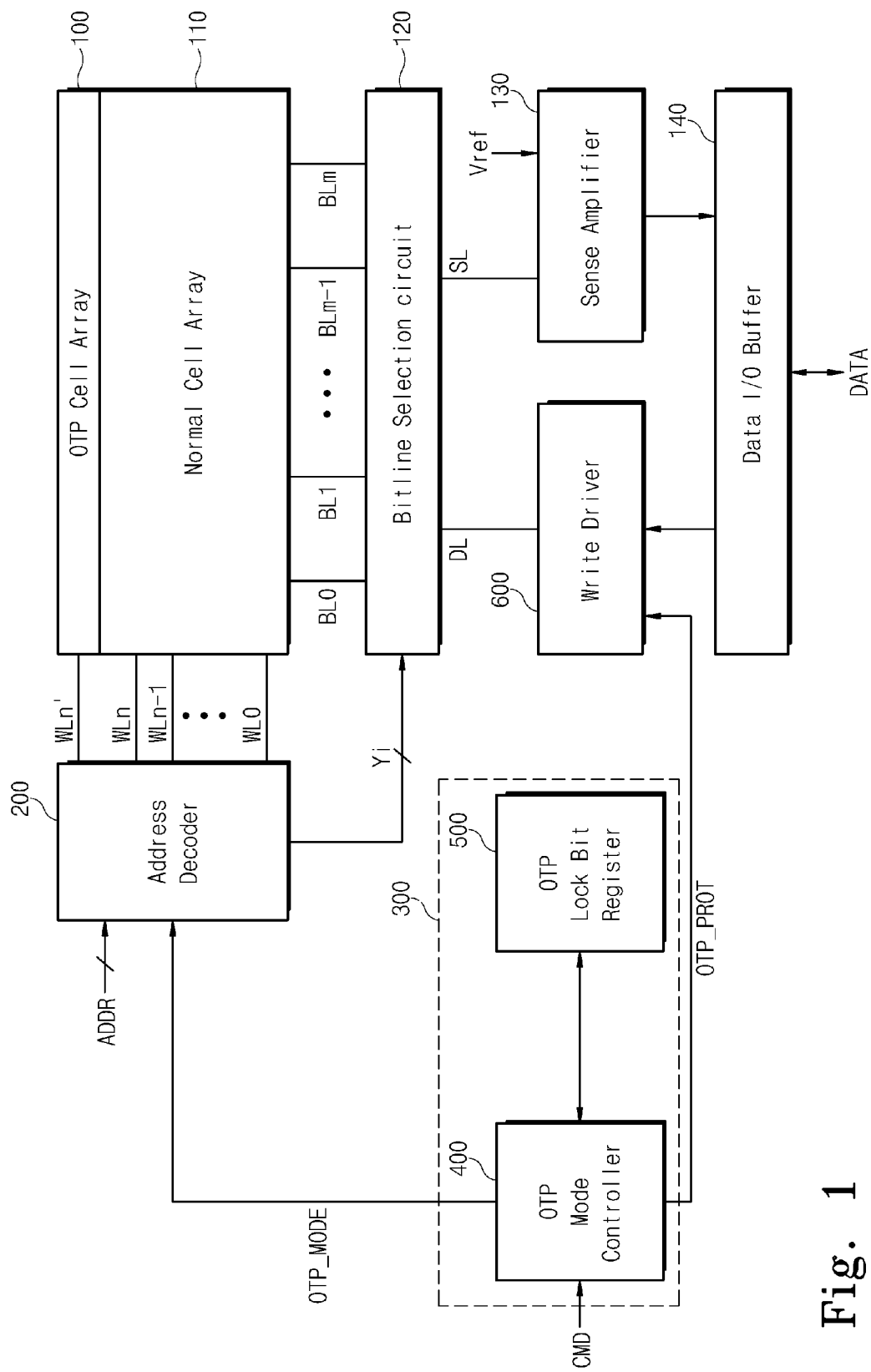
FIG. 1 is a block diagram of a nonvolatile memory device according to an embodiment of the inventive concept.

FIG. 1 is a block diagram of a nonvolatile memory device according to an embodiment of the inventive concept.

Referring to FIG. 1, the nonvolatile memory device comprises an OTP cell array 100, a normal cell array 110, a bitline selection circuit 120, a sense amplifier 130, a data input-output (I/O) buffer 140, an address decoder 200, an OTP controller 300, and a write driver 600. OTP controller 300 comprises an OTP mode controller 400 and an OTP lock bit register 500.

The nonvolatile memory device prohibits a program operation of OTP cell array 100 in response to program protection information stored in OTP lock bit register 500 and allows the program operation in response to program unprotection information stored in OTP lock bit register 500.

OTP cell array 100 and normal cell array 110 each comprise a plurality of memory cells. Each of the memory cells comprises a variable-resistance element GST and a selection element MT. Selection element MT typically comprises a transistor or a diode. Each memory cell is connected to one of wordlines WL0 through WLn or WLn' and one of bitlines BL0 through BLm. OTP cell array 100 is connected to wordline WLn'. A structure of OTP cell array 100 and normal cell array 110 will be explained in further detail with reference to FIGS. 2 and 3.

OTP cell array 100 stores security data. The security data typically comprises information regarding the nonvolatile memory device, such as a manufacturer name, serial number, and date of manufacture. OTP cell array 100 must be protected from unauthorized manipulation. Accordingly, in a program operation, OTP cell array 100 refers to program protection information stored in OTP lock bit register 500 to determine whether access is allowed.

A conventional OTP cell array allows a one-time program operation. However, the nonvolatile memory device of FIG. 1 can permit multiple program operations to OTP cell array 100 by referring to program protection information.

Address decoder 200 receives an address ADDR and an OTP_MODE signal as an input. Address ADDR is divided into a row address for selecting one of wordlines WL0 through WLn or WLn' and a column address for selecting one of bitlines BL0 through BLm. The OTP_MODE signal is a signal to select OTP cell array 100. In other words, where OTP_MODE signal is enabled, wordline WLn' of OTP cell array 100 of is selected.

Bitline selection circuit 120 connects data line DL to a corresponding one of bitlines BL0 through BLm in response to a bitline selection signal Yi from address decoder 200. Bitline selection circuit 120 typically comprises one or more NMOS transistors.

During a read operation, sense amplifier 130 detects a difference between a sensing line SL voltage and a reference voltage Vref and identifies data stored in selected memory cells according to the detected difference. Reference voltage Vref is provided by a reference voltage generation circuit. Data I/O buffer 140 then outputs data DATA received from sense amplifier 130 to an external destination.

OTP controller 300 controls program operations of OTP cell array 100. During a program operation of OTP cell array 100, OTP controller 300 controls address decoder 200 and write driver 600.

OTP mode controller 400 generates OTP_MODE signal in response to an external command CMD and data stored in OTP lock bit register 500. As indicated above, the OTP_MODE signal is used to select OTP cell array 100.

Accordingly, address decoder 200 selects wordline WLn' connected to OTP cell array 100 in response to the OTP_MODE signal.

OTP mode controller 400 changes data stored in OTP lock bit register 500 in response to external command CMD. OTP mode controller 400 stores the program protection information in OTP lock bit register 500 to protect data stored in OTP cell array 100. On the other hand, OTP mode controller 400 stores the program unprotection information in OTP lock bit register 500 to allow data stored in OTP cell array 100 to be changed.

OTP mode controller 400 refers to data stored in OTP lock bit register 500. Where the program protection information is stored in OTP lock bit register 500, OTP mode controller 400 does not generate the OTP_MODE signal. On the other hand, where the program unprotection information is stored in OTP lock bit register 500, OTP mode controller 400 generates the OTP_MODE signal.

Where the program protection information is stored in OTP lock bit register 500, OTP mode controller 400 generates an OTP protection signal OTP_PROT. OTP protection signal OTP_PROT is a signal for restricting a program operation to OTP cell array 100. OTP protection signal OTP_PROT is provided to write driver 600. On the other hand, where the program unprotection information is stored in OTP lock bit register 500, OTP mode controller 400 does not generate OTP protection signal OTP_PROT.

Write driver 600 supplies a program current to selected memory cells during program operations. The program current can take the form of a set current or a reset current. The set current places a variable-resistance material in a set state, and the reset current places the variable-resistance material in a reset state.

Write driver 600 receives data DATA through data I/O buffer 140. Write driver 600 supplies the set current or the reset current to data line DL in response to data DATA. For example, write driver 600 can provide the reset current in response to data '1', and it can provide the set current in response to data '0'.

Write driver 600 shuts off the set current or the reset current in response to OTP protection signal OTP_PROT. Accordingly, the nonvolatile memory device blocks a program operation of OTP cell array 100 in response to OTP protection signal OTP_PROT.

As indicated by the foregoing, the nonvolatile memory device of FIG. 1 stores program protection information or program unprotection information in OTP lock bit register 500 and prohibits or conducts a program operation on OTP cell array 100 according to the stored information. Consequently, security data can be stored securely and changed as need arises.

Various examples of nonvolatile memory devices comprising phase-change one-time-programmable memory cells are disclosed in U.S. Patent Publication No. 2007/0133269, the disclosure of which is hereby incorporated by reference in its entirety.

Figure 2:
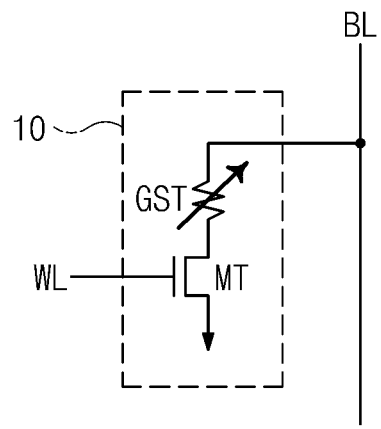
FIG. 2 is a circuit diagram of a variable-resistance memory cell.

FIG. 2 is a circuit diagram illustrating an example of a variable-resistance memory cell. OTP lock bit register 500 can be implemented by a variable-resistance memory cell such as that illustrated in FIG. 2.

Referring to FIG. 2, a variable-resistance memory cell 10 comprises a variable-resistance element GST and a selection element MT. Variable-resistance element GST is connected to a bitline BL, and selection element MT connects variable-resistance element GST to ground. A gate of selection element MT is connected to a wordline WL.

Selection element MT turns on in response to a voltage applied to wordline WL. Where selection element MT is turned on, variable-resistance element GST receives a current through bitline BL.

Variable-resistance element GST comprises a phase change material. The phase change material typically comprises Germanium-Antimony-Tellurium (GST), which changes its resistance in response to heat. The phase change material can be placed in two different stable states in response to temperature changes. The two stable states are a crystalline state and an amorphous state.

The phase change material changes to the crystalline state or the amorphous state in response to current supplied through bitline BL. The variable-resistance memory device programs data using this characteristic of the phase change material. Examples of variable-resistance memory cells using such a phase change material are described in U.S. Patent Publication No. 2007/0133269.

Figure 3:
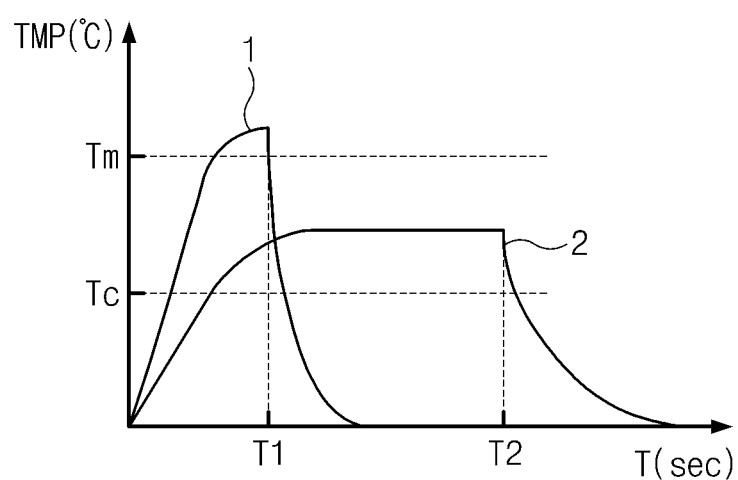
FIG. 3 is a graph illustrating characteristics of the variable-resistance memory cell.

FIG. 3 is a graph illustrating characteristics of the variable-resistance memory cell of FIG. 2. In FIG. 3, a reference numeral "1" represents temperature conditions corresponding to the amorphous state of the phase change material, and a reference numeral "2" represents temperature conditions corresponding to the crystalline state of the phase change material.

Referring to FIG. 3, the phase change material is changed to the amorphous state by heating it a temperature higher than a melting temperature Tm and then quenching it after a time T1. The amorphous state is usually called a reset state and the reset state stores data '1'.

On the other hand, the phase change material is changed to the crystalline state by heating it to a temperature between crystallization temperature Tc and melting temperature Tm during and then slowly cooling it after a time T2. The crystalline state is usually called a set state and the set state stores data '0'.

The resistance of the variable-resistance memory cell depends on amorphous volume of the phase change material. The resistance of the memory cell is high when it is in the amorphous state and low when it is in the crystalline state.

As indicated by the foregoing, the variable-resistance memory cell can be reset by heat. Accordingly, an unauthorized person could potentially reset OTP lock bit register 500 by applying heat from an external source. Consequently, the unauthorized person could cause OTP lock bit register 500 to store program unprotection information. It is desirable, however, for OTP lock bit register 500 to maintain the program protection information even when heat is applied from an external source.

Accordingly, in certain embodiments of the inventive concept, the reset state is defined as program protection information and the set state is defined as program unprotection information. As a result, OTP lock bit register 500 maintains the program protection information even if heat is applied from an external source.

Figure 4:
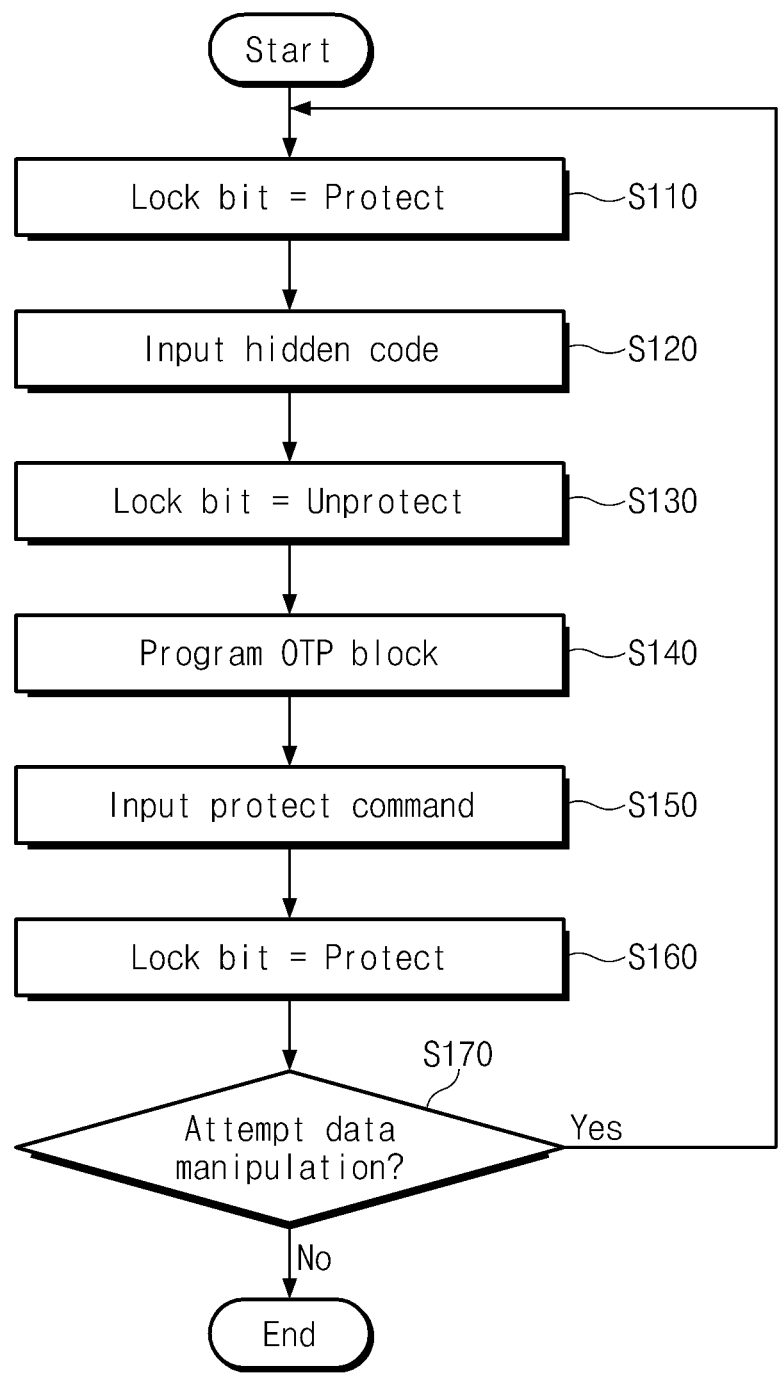
FIG. 4 is a flowchart illustrating a method of modifying data stored in an OTP lock bit register comprising a variable-resistance memory cell.

FIG. 4 is a flowchart illustrating a method of modifying data stored in an OTP lock bit register comprising a variable-resistance memory cell. The method will be described with reference to the variable-resistance memory device of FIG. 1. In the description that follows, example method steps will be indicated by parentheses (SXXX).

Referring to FIG. 4, OTP lock bit register 500 stores program protection information by default (S110). In a program protection state, data stored in an OTP block of OTP cell array 100 cannot be changed.

A security code (also referred to as a hidden code) is provided to a vendor desiring to write data to the OTP block.

The vendor can cause OTP lock bit register 500 to store program unprotection information by entering the hidden code (S120). The vendor typically applies the hidden code to OTP mode controller 400. OTP mode controller 400 then instructs OTP lock bit register 500 to store program unprotection information in response to the hidden code (S130).

OTP mode controller 400 applies the OTP_MODE signal to address decoder 200 to select the OTP block. Meanwhile, OTP mode controller 400 does not apply the OTP_PROT signal to write driver 600 so that write driver 600 can perform the program operation on the OTP block (S140).

After the program operation of the OTP block, a protection command is received from an external source (S150). In response to the protection command, OTP mode controller 400 instructs OTP lock bit register 500 to store the program protection information (S160). As a result, data stored in OTP cell array 100 is protected.

Where an unauthorized access attempt is made to OTP lock bit register 500 (S170), the data stored in OTP lock bit register 500 indicates protection state (S110). Accordingly, the unauthorized access attempt will be rejected.

Figure 5:
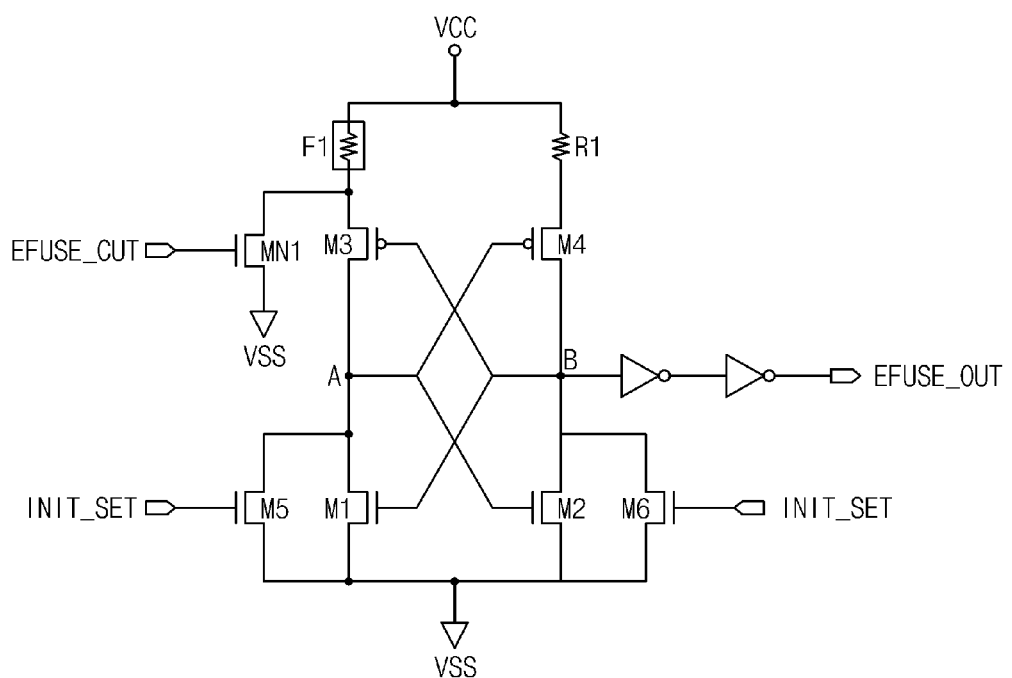
FIG. 5 is a circuit diagram illustrating an E-fuse circuit comprising a latch type current-sense amplifier.

FIG. 5 is a circuit diagram illustrating an E-fuse circuit comprising a latch type current-sense amplifier. In certain embodiments of the inventive concept, OTP lock bit register 500 is implemented using the E-fuse circuit of FIG. 5.

Referring to FIG. 5, a first node of an E-fuse F1 and a first node of a resistor R1 are connected to an external supply voltage VCC. A second node of E-fuse F1 is connected to a cutting driver transistor MN1. Cutting driver transistor MN1 is controlled by a cutting control signal EFUSE_CUT.

Transistors M1, M2, M3, and M4 form a complementary latch. The complementary latch places nodes A and B in opposite states. At initial power-up, node A and node B are in random states due to a parasitic load.

Transistors M5, M6, M3, and M4 form a current-sense amplifier. Transistors M5 and M6 are controlled by an initial signal INIT_SET. Initial signal INIT_SET can be provided by an output signal of a mode register set MRS in a semiconductor memory device.

To determine initial voltages of node A and node B, a resistance of resistor R1 is set to a value larger than a resistance of E-fuse F1. A small current difference occurs in nodes A and B according to the resistance difference between E-fuse F1 and resistor R1. In addition, a small voltage difference will occur between node A and node B.

As initial signal INIT_SET transitions from logical "high" to logical "low", the complementary latch formed by transistors M1, M2, M3, and M4 amplifies a small voltage difference between node A and node B.

Next, where cutting control signal EFUSE_CUT transitions to logical "high", cutting driver transistor MN1 is turned on. Where cutting driver transistor MN1 is turned on, a significant current flows therethrough, and the significant current cuts E-fuse F1. As a result, the resistance of E-fuse F1 exceeds that of resistor R1.

Where initial signal INIT_SET transitions to logical "high", the current-sense amplifier operates. The current-sense amplifier generates a small voltage difference between node A and node B. When initial signal INIT_SET transitions to logical "low", the complementary latch reverses the voltages of node A and node B. In this way, the complementary latch stores information indicating that E-fuse F1 is cut. Signals needed to drive the E-fuse can be provided by OTP mode controller 400.

Figure 6:
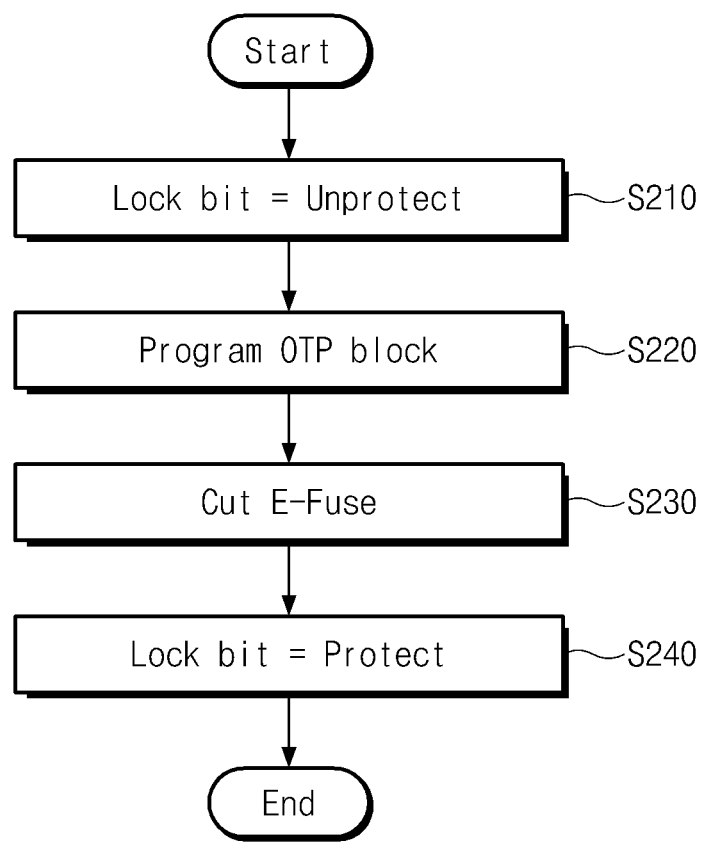
FIG. 6 is a flowchart illustrating a method of modifying data stored in an OTP lock bit register comprising an E-fuse.

FIG. 6 is a flowchart illustrating a method of modifying data stored in an OTP lock bit register comprising an E-fuse.

Referring to FIG. 6, OTP lock bit register 500 stores program unprotection information by default (S210). In a program unprotection state, data in the OTP block can be changed.

Because the default state is an unprotected state, hidden code is unnecessary. OTP mode controller 400 applies the OTP_MODE signal to address decoder 200 to select the OTP block. In addition, OTP mode controller 400 does not apply the OTP_PROT signal to write driver 600 (or applies deactivated OTP_PROT signal to write driver 600). Thus, write driver 600 performs a program operation on the OTP block (S220).

After the program operation for the OTP block, E-fuse F1 is cut (S230). A vendor typically cuts E-fuse F1 by applying a command to OTP mode controller 400. As a consequence of cutting E-fuse F1, OTP lock bit register 500 stores program protection information (S240). Therefore, data stored in the OTP block is protected.

As indicated by the foregoing, by using E-fuse F1 for OTP lock bit register 500, the program protection information is not changed to program unprotection information by external manipulation. An E-fuse has a characteristic that is irreversible. Therefore, data stored in the OTP block may be protected. Accordingly, the security and reliability of the nonvolatile memory device are improved.

In the embodiment of FIG. 6, the E-fuse circuit comprises a latch type current-sense amplifier. However, the E-fuse circuit can be implemented in other forms.

Figure 7:
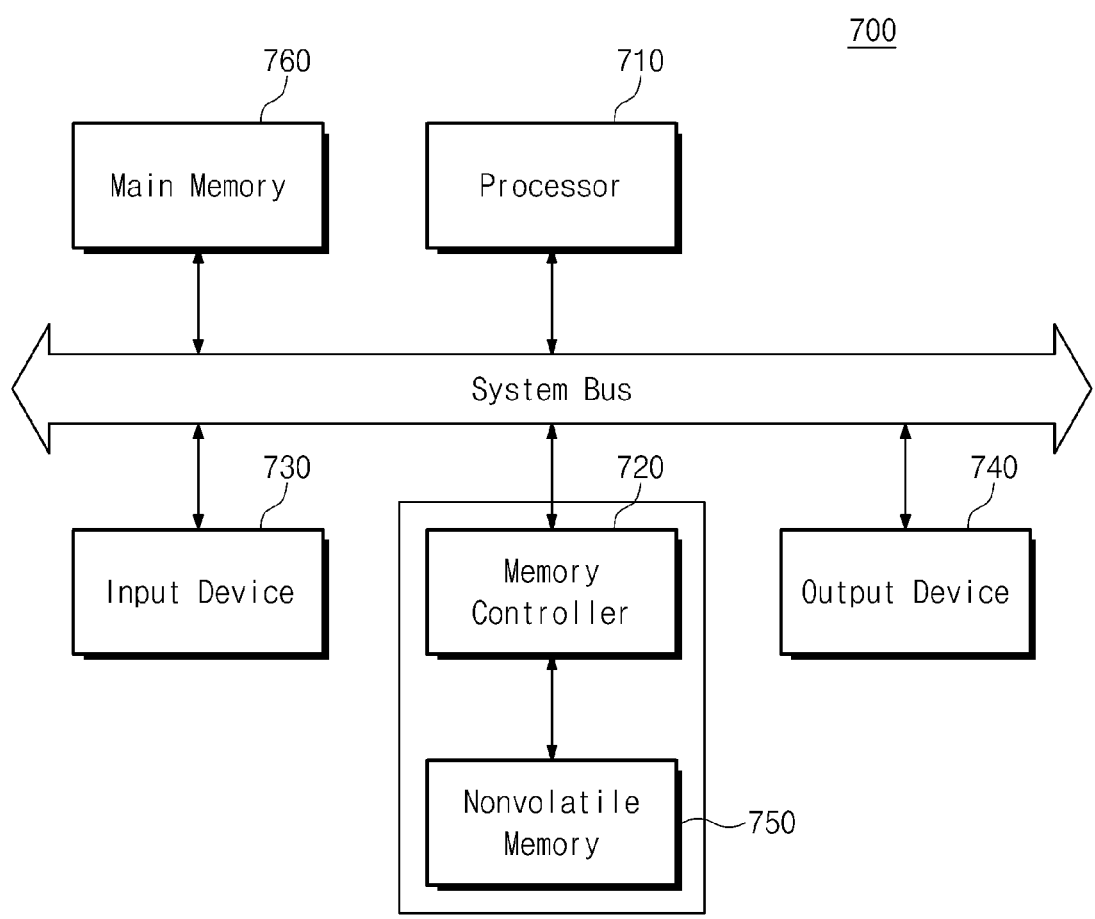
FIG. 7 is a block diagram illustrating a computational system comprising one or more integrated circuit devices each comprising at least one nonvolatile memory device according to an embodiment of the inventive concept.

FIG. 7 is a block diagram illustrating a computational system 700 comprising one or more integrated circuit devices each comprising at least one nonvolatile memory device according to an embodiment of the inventive concept.

Referring to FIG. 7, computational system 700 comprises a processor 710, a main memory 760, an input device 730, a memory controller 720, a nonvolatile memory 750, and an output device 740 connected via a system bus. One or both of main memory 760 and nonvolatile memory 750 comprises a plurality of memory devices. In certain embodiments, the plurality of memory devices is arranged on a memory card, such as a printed circuit board physically mounting and operatively connecting the plurality of memory devices.

Computational system 700 receives data from an external source through input device 730. The received data can comprise, for instance, a command from a user or multi-media data. The received data is stored in nonvolatile memory 750 or main memory 760.

Results generated by processor 710 are stored in nonvolatile memory 750 or main memory 760. Output device 740 outputs the data stored in nonvolatile memory 750 or main memory 760. Output device 740 outputs digital data in a human-perceivable form. Output device 740 can comprise, for instance, a display or speaker. The method of FIG. 4 or 6 can be applied to nonvolatile memory 750. As the security of nonvolatile memory 750 improves, the security of the computational system improves accordingly.

Nonvolatile memory 750 or memory controller 720 can be mounted in various types of packages. Examples of these packages or package types include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline package (TSOP), system in package (SIP), multi chip package (MCP), wafer-level fabricated package (WFP), and wafer-level processed stack package (WSP).

In some embodiments, computational system 700 is a portable device. In such embodiments, computational system 700 can comprise a portable battery.

Computational system 700 can take a variety of alternative forms, such as a mobile phone, an MP3 player, a navigation system, a solid state disk (SSD), or a household appliance, to name but a few.

Figure 8:
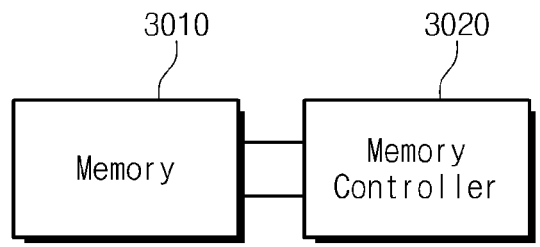
FIG. 8 is a block diagram illustrating a memory system according to an embodiment of the inventive concept.

FIG. 8 is a block diagram illustrating a memory system according to an embodiment of the inventive concept.

Referring to FIG. 8, the memory system comprises a memory 3010 connected to a memory controller 3020. Memory 3010 can take the form of one of the semiconductor devices described above.

Memory controller 3020 supplies input signals for controlling the operation of memory 3010. For example, memory controller 3020 supplies command and address signals to control memory 3010. Memory controller 3020 comprises a memory interface, a host interface, an error detection/correction (ECC) circuit, a central processing unit (CPU), and a buffer memory.

The memory interface provides data transmitted from the buffer memory to memory 3010 and transmits data read out of memory 3010 to the buffer memory. The memory interface provides commands and addresses transmitted from an external host to memory 3010.

The host interface communicates with the external host using a protocol such as universal serial bus (USB), small computer system interface (SCSI), peripheral component interconnect (PCI) express, advanced technology attachment (ATA), parallel ATA (PATA), serial ATA (SATA), or serial attached SCSI (SAS).

The ECC circuit generates a parity bit using data transmitted to memory 3010. The generated parity bit is stored in a specific area of memory 3010, together with data. The ECC circuit detects errors in data read out of memory 3010. Where the detected errors are within a correctable range, the ECC circuit corrects the detected errors.

The CPU analyzes input signals received from the external host and processes the input signals. The CPU controls the external host or memory 3010 through the host interface or the memory interface. The CPU controls write, read, and erase operations according to firmware used to drive memory 3010.

The buffer memory temporarily stores write data provided from the external host or data read out of memory 3010. The buffer memory also stores metadata or cache data to be stored in memory 3010. In an unexpected power outage, metadata or cache data stored in the buffer memory is stored in memory 3010. The buffer memory typically comprises a DRAM or an SRAM.

Figure 9:
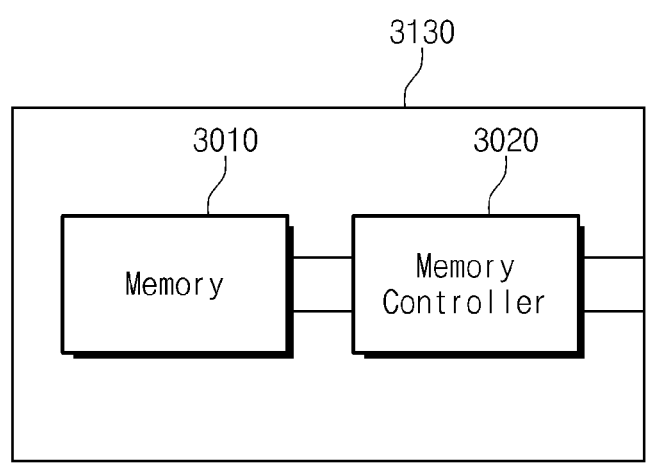
FIG. 9 is a block diagram illustrating a memory card according to an embodiment of the inventive concept.

FIG. 9 is a block diagram illustrating a memory card 3130 according to an embodiment of the inventive concept. The embodiment of FIG. 9 is the same as the embodiment of FIG. 8, except that memory 3010 and memory controller 3020 are incorporated in memory card 3130.

Memory card 3130 can take a variety of forms, such as a flash memory card or another type of card meeting an industry standard for use with consumer electronics devices such as digital cameras, personal computers, etc. Memory controller 3020 controls memory 3010 based on controls signals received by memory card 3130 from an external device.

Figure 10:
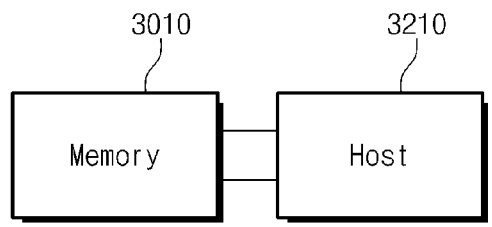
FIGS. 10 through 17 are block diagrams illustrating various electronic systems comprising memory devices according to alternative embodiments of the inventive concept.

FIG. 10 is a block diagram illustrating memory 3010 connected to a host system 3210.

Host system 3210 can comprise a processing system such as a personal computer, or a digital camera. Host system 3210 may use memory 3010 as a removable storage medium. Host system 3210 supplies input signals for controlling operation of memory 3010. For example, host system 3210 can supply command and address signals to memory 3010.

Figure 11:
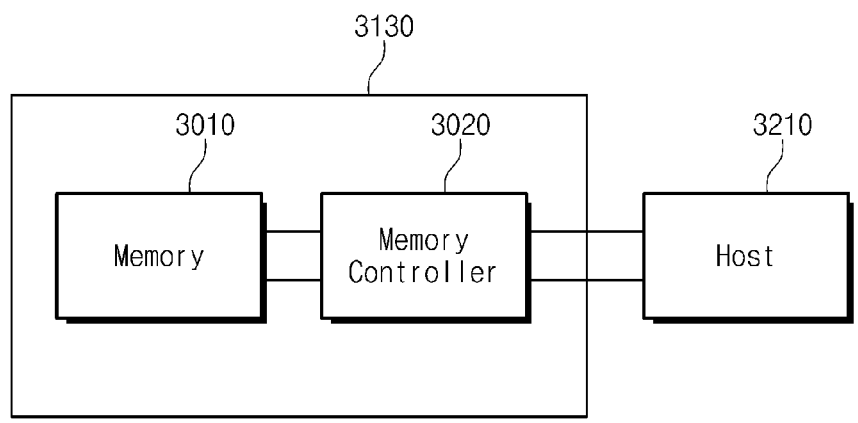

FIG. 11 is a block diagram illustrating a system comprising memory card 3130 connected to host system 3210. Host system 3210 applies control signals to memory card 3130, and memory controller 3020 controls the operation of memory 3010 in response to the control signals.

Figure 12:
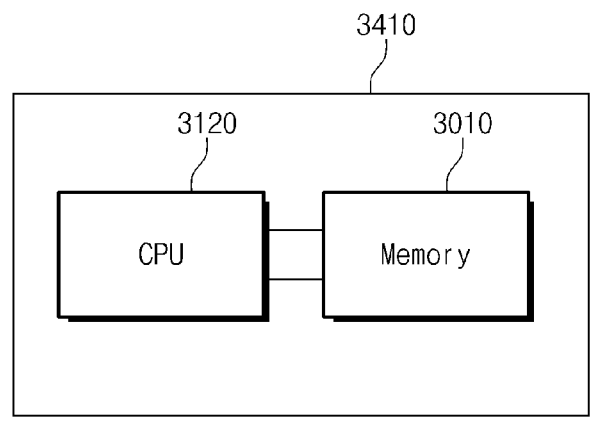

FIG. 12 is a block diagram illustrating a computer system 3410 comprising CPU 3120 connected to memory 3010. Computer system 3410 can take a variety of forms, such as a personal computer or a personal data assistant. Memory 3010 can be directly connected to CPU 3120, or intervening components may be present. For simplicity, FIG. 11 does not illustrate all of the features that can be included within computer system 3410.

Figure 13:
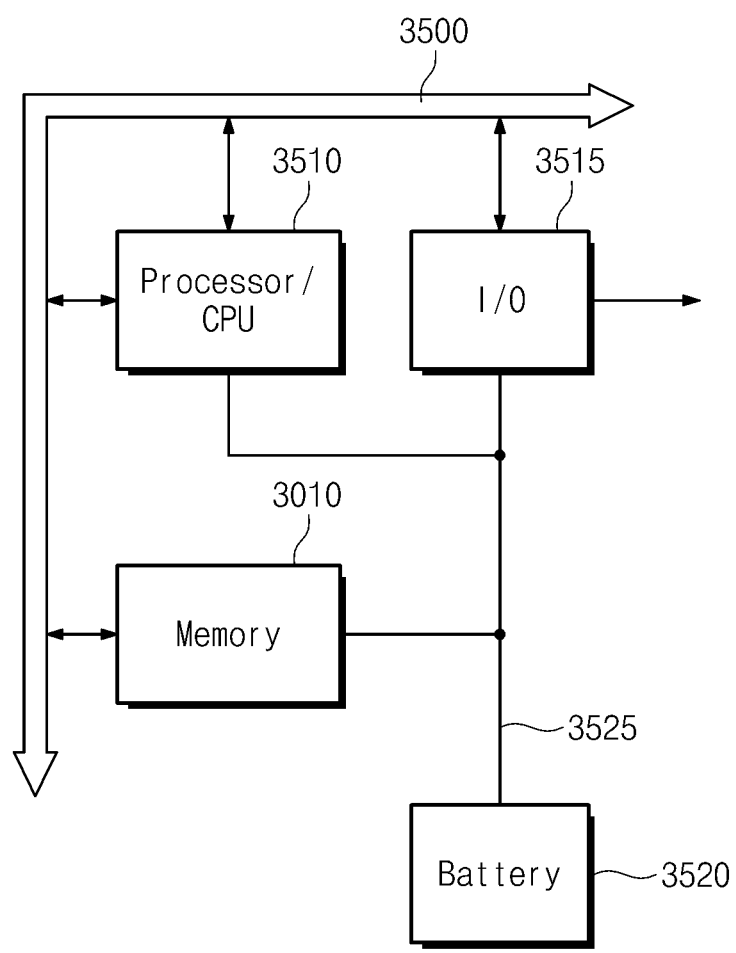

FIG. 13 is a block diagram illustrating a portable computing system comprising a memory according to an embodiment of the inventive concept.

Referring to FIG. 13, the portable computing system comprises memory 3010, which can take the form of one of the semiconductor memory devices described above. In this and other embodiments, memory 3010 can comprise one or more integrated circuit dies each comprising a memory array that operates in conjunction with a method such as those described in relation to FIGS. 4 and 6. These IC dies can be separate, stand alone memory devices arranged in modules such as conventional DRAM modules, or they can be integrated with other on-chip functionalities. In certain embodiments, memory 3010 can be part of an I/O processor or a microcontroller.

The portable computing system of FIG. 13 can take any of several forms, such as a portable notebook computer, a digital still or video camera, a personal digital assistant, a mobile hand-held telephone unit, a navigation device, a global positioning system (GPS) system, or an audio and/or video player. Memory 3010 can also be incorporated in a variety of non-portable devices, such as large network servers or other computing devices that can benefit from nonvolatile memory devices.

The portable computing system of FIG. 13 comprises a processor/CPU 3510 that uses memory 3010 as program memory to store code and data for its execution. Alternatively, memory 3010 can be used as a mass storage device for nonvolatile storage of code and data. The portable computing system can communicate with other devices, such as a personal computer or a network of computers, via an I/O interface 3515. I/O interface 3515 can provide access to a computer peripheral bus, a high speed digital communication transmission line, or an antenna for unguided transmissions. Data communication between processor/CPU 3510 and memory 3010, as well as between processor/CPU 3510 and I/O interface 3515 can be accomplished using a bus 3500.

In various alternative embodiments, memory 3010 can be replaced with memory card 3130 of FIG. 9, and communication with processor/CPU 3510 can be conducted via memory controller 3020. Furthermore, I/O interface 3515 can communicate with memory 3010 via memory controller 3020 or directly with memory 3010 if memory controller 3020 is not present. In portable applications, the above-described features are typically powered by a battery 3520 via a power supply bus 3525.

Figure 14:
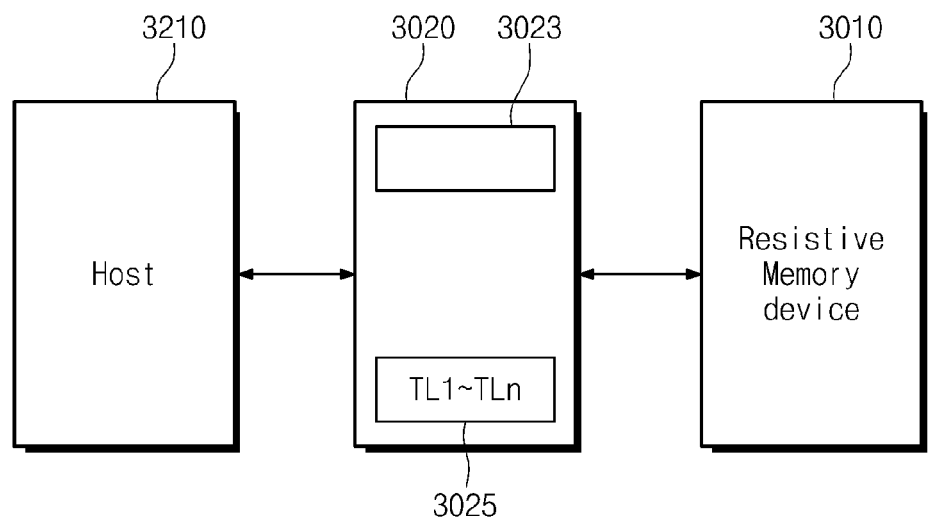

FIG. 14 is a block diagram illustrating a memory system 3700 according to an embodiment of the inventive concept.

Referring to FIG. 14, memory system 3700 comprises memory 3010, memory controller 3020, and host system 3210. Memory 3010 comprises a resistive memory device configured to store single-bit data or multi-bit data in each memory cell. A memory cell that stores single-bit data is called a "single-bit cell", and a memory cell that stores multi-bit data is called a "multi-bit cell". A method of operating memory controller 3020 is described below with respect to an example where memory cells of memory 3010 store multi-bit data.

Memory controller 3020 is configured to control memory 3010 in response to an access request from host system 3210. Memory controller 3020 maps a logical address of input data to a first physical address corresponding to first order data (e.g., least significant bit (LSB) data) of multi-bit cells in memory 3010. After mapping the logical address of program data to the first physical address of the first bit, memory controller 3020 sequentially maps a logical address of program data to a second physical address corresponding to second order data (e.g., most significant bit (MSB) data) of multi-bit cells in memory 3010.

The mapped first and second physical addresses are provided to memory 3010. Memory 3010 sequentially writes program data into second bits of multi-bit cells in memory 3010 after first writing the program data into first bits of multi-bit cells in memory 3010 in sequence of the mapped first and second physical addresses.

Memory controller 3020 comprises a control block 3023 and a memory 3025. One or more translation layers TL1 through TLn are stored in memory 3025. When an access is requested from host system 3210, control block 3023 maps a logical address of program data to a physical address of a multi-bit memory cell using translation layers TL1 through TLn.

Memory controller 3020 determines whether an access request from host system 3210 is associated with an area of memory 3010 using translation layers TL1 through TLn. Memory controller 3020 selects one of translation layers TL1 through TLn according to a result of the determination and manages mapping information of memory 3010 according to a selected translation layer.

To write a small amount of data, control block 3023 selects a translation layer based on page mapping and performs a write operation by page unit. According to the selected translation layer, a logical address of program data is first mapped to first physical addresses by a unit of page before being mapped to second physical addresses. Consequently, memory 3010 performs a write operation by a page unit.

To write a large amount of data, control block 3023 selects a translation layer based on block mapping and performs a write operation by block unit. According to the selected translation layer, a logical address of program data is first mapped to first physical addresses by block unit before being mapped to second physical addresses. Consequently, memory 3010 performs a write operation by block unit. This approach can be applied to a whole area of the memory cell array in memory 3010 without performing a write operation by page unit or block unit.

In certain embodiments, a semiconductor device can be used as a storage class memory. The storage class memory can be used for both data storage and program code storage. In various embodiments, memory devices such as PRAM, FeRAM, and MRAM can be used for a variety of purposes, such as general data storage, as replacements for conventional flash memory, and as main memory applications such as SRAM.

Figure 15:
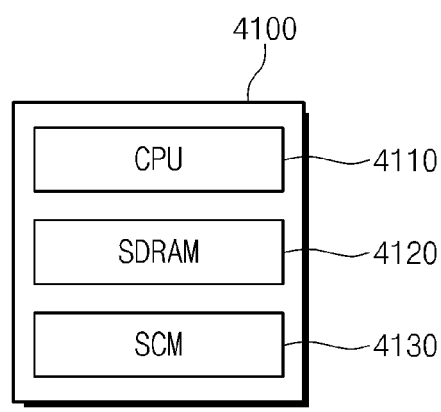

FIG. 15 is a block diagram illustrating a memory system 4100 according to an embodiment of the inventive concept. In this embodiment, an SCM is used instead of a flash memory. Memory system 4100 comprises a CPU 4110, an SDRAM 4120, and an SCM 4130 used instead of a flash memory.

In memory system 4100, data access speed of SCM 4130 is higher than that of a flash memory. For example, in a PC environment where CPU 4110 runs at 4 GHz, data access speed of a PRAM, which is a type of SCM 4130, is about 32 times higher than that of a flash memory. Thus, memory system 4100 equipped with SCM 4130 can achieve higher-speed access than a memory system equipped with a flash memory.

Figure 16:
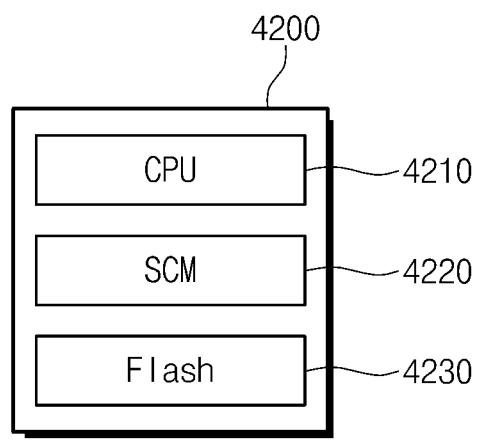

FIG. 16 is a block diagram illustrating a memory system 4200 according to an embodiment of the inventive concept. In the embodiment of FIG. 16, an SCM is used instead of an SDRAM.

Referring to FIG. 16, memory system 4200 comprises a CPU 4210, an SCM 4220, and a flash memory 4230. SCM 4130 is used as a main memory instead of an SDRAM.

In memory system 4200, power dissipation of SCM 4220 is lower than that of an SDRAM. Energy dissipation for a main memory in a computer system may account for up to 40 percent of total energy use. Accordingly, improvements in the energy efficiency of main memory can significantly lower power consumption of a computer system. Incorporation of an SCM can reduce energy dissipation requirements by an average of about 53 percent, and reduce energy dissipation caused by power leakage by an average of about 73 percent. As a result, memory system 4200 equipped with SCM 4220 allows power dissipation to be reduced more than a memory system equipped with an SDRAM.

Figure 17:
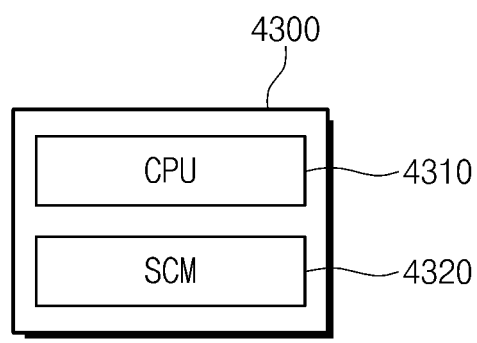

FIG. 17 is a block diagram illustrating a memory system 4300 according to an embodiment of the inventive concept. In the embodiment of FIG. 17, an SCM is used to replace an SDRAM and a flash memory.

Referring to FIG. 17, memory system 4300 comprises a CPU 4310 and an SCM 4320. SCM 4320 is used as a main memory instated of an SDRAM and as a data storage memory instead of a flash memory. Memory system 4300 provides relatively efficient data access speed, power consumption, space utilization, and cost.

Figure 18:
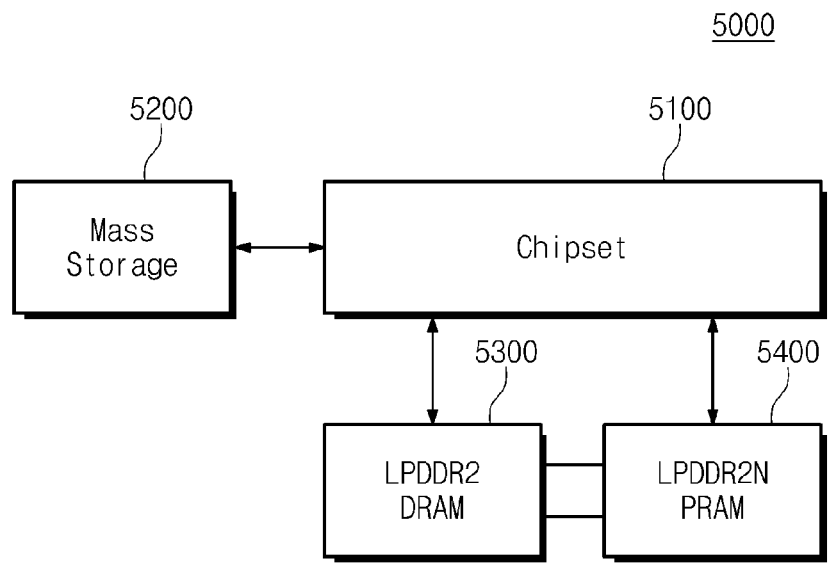
FIG. 18 is a block diagram illustrating a mobile system comprising a variable-resistance memory device according to an embodiment of the inventive concept.

FIG. 18 is a block diagram illustrating a mobile system 5000 comprising a variable-resistance memory device according to an embodiment of the inventive concept.

Referring to FIG. 18, memory system 5000 comprises a chipset 5100, a mass storage 5200, an LPDDR2-DRAM 5300, and an LPDDR2N-PRAM 5400. Mass storage 5200 is a high-capacity storage such as a hard disk drive (HDD) or a flash memory. LPDDR2-DRAM 5300 is a low-power DDR2 DRAM, and LPDDR2N-PRAM 5400 is a low-power DDR2 nonvolatile PRAM acting as a variable-resistance memory device.

DRAM can consume a large amount of standby current because it performs a refresh operation even in a standby state. Increasing the standby current causes power of a battery to be consumed, reducing the amount of time that mobile system 5000 can go without recharging. A variable-resistance memory device (e.g., PRAM) according to certain embodiments of the inventive concept does not need to perform a refresh operation. Therefore, if the variable-resistance memory device is used instead of a DRAM or together with a DRAM, mobile system 5000 can reduce power consumption.

Figure 19:
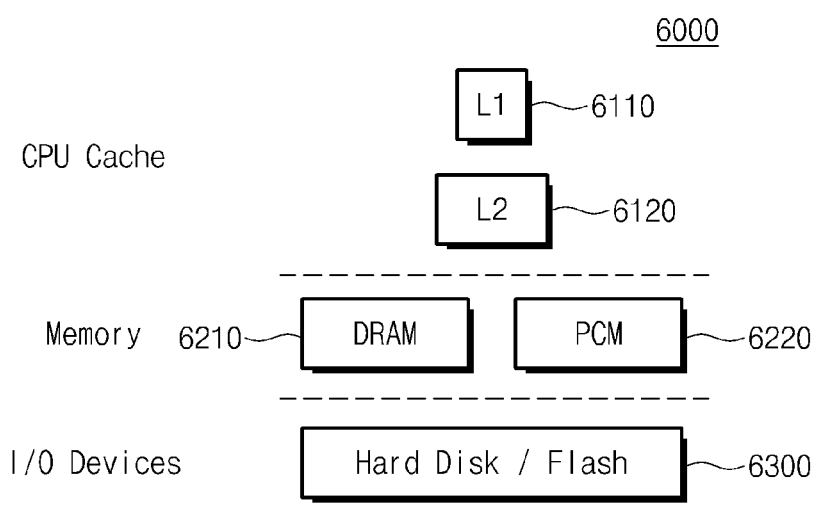
FIG. 19 is a block diagram illustrating a hierarchical structure of a computer system comprising a variable-resistance memory device according to an embodiment of the inventive concept.

FIG. 19 is a block diagram illustrating a hierarchical structure of a computer system 6000 comprising a variable-resistance memory device according to an embodiment of the inventive concept.

Referring to FIG. 19, computer system 6000 comprises a CPU cache memory in an upper layer, a DRAM and a phase change memory (PCM) in a middle layer, and a hard disk or a flash memory in a lower layer. In the hierarchical structure illustrated in FIG. 19, data access speed is highest in the upper layer and lowest in the lower layer. In some embodiments, a variable-resistance memory device can be substituted for a DRAM or used as a memory in the middle layer together with a DRAM, within computer system 6000.

The CPU cache memory in the upper layer can comprise a level 1 (L1) memory and a level 2 (L2) memory. The L1 memory and the L2 memory are arranged in a cache memory layer inside computer system 5000. In a memory region of the middle layer, a DRAM 6210 and a PCM 6200 can be used together. For example, a 256-megabyte DRAM 6210 and a 1-gigabyte PCM 6220 can be installed a computer system after being merged into a module.

DRAM 6210 can function as a main memory for processing data from a CPU at high speed and PCM 6220 can function to store the data. Similar to an external peripheral device, a lower layer of a hard disk drive or a flash memory device 6300 may store data through a predetermined interface such as ATA/SATA or communicate with a main memory or the CPU.

A variable-resistance memory device according to certain embodiments of the inventive concept can be incorporated in a server-oriented SSD. For example, U.S. Patent Publications Nos. 2008/0256292, 2008/0256183, and 2008/0168304 variously disclose a solid-state storage comprising a PRAM, a flash memory, an MRAM, an NRAM, and DRAM, as well as a solid-state storage device comprising a solid-state storage controller and a solid-state storage. U.S. Patent Publications Nos. 2008/0256292, 2008/0256183, and 2008/0168304 disclosed a solid-state memory and controller improving the speed of a high-speed interface as well as a redundant array of independent drivers (RAID) in a solid-sate device. The respective disclosures of these U.S. patent publications are hereby incorporated by reference in their entirety.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A nonvolatile memory device, comprising:
a variable-resistance memory cell array comprising a memory block that stores protected data;
a register that stores lock state information indicating whether the protected data is changeable, wherein the register comprises a variable-resistance memory cell and an initial value of the lock state information is set to a program protection state; and
a mode controller that changes the protected data stored in the memory block in response to the lock state information,
wherein the mode controller causes the register to store program unprotection information in response to a hidden code received from an external source.

2. The nonvolatile memory device of claim 1, further comprising:
an address decoder that selects the memory block,
wherein the mode controller causes the address decoder to select the memory block where the register stores program unprotection information.

3. The nonvolatile memory device of claim 1, further comprising:
a write driver that programs the memory block,
wherein the mode controller causes the write driver to program the memory block where the register stores program unprotection information.

4. The nonvolatile memory device of claim 1, wherein the lock state information comprises program protection information or program unprotection information.

5. The nonvolatile memory device of claim 1, wherein the variable-resistance memory cell array comprises phase-change memory cells.

6. The nonvolatile memory device of claim 1, wherein the variable-resistance memory cell comprises a phase-change memory cell and the program protection state corresponds to an amorphous state of a phase-change material in the phase-change memory cell.

7. A method of operating a nonvolatile memory device comprising a variable-resistance memory cell array comprising a memory block that stores protected data, and a variable-resistance memory cell that stores lock state information indicating whether the protected data is changeable, the method comprising:
initializing the variable-resistance memory cell to a program protection state;
receiving a security code;
in response to the security code, changing the variable-resistance memory cell to a program unprotection state;
while the variable-resistance memory cell is in the program unprotection state, programming the memory block;
receiving a data protection command; and
in response to the protection command, changing the variable-resistance memory cell to the program protection state.

8. The method of claim 7, wherein the memory block is a one-time-programmable memory block.

9. The method of claim 7, wherein the nonvolatile memory device is a phase-chance random access memory device.

10. The method of claim 7, further comprising:
receiving a request to access the memory block; and
rejecting the request upon determining that the variable-resistance memory cell is in the program protection state.

11. The method of claim 7, wherein the variable-resistance memory cell is a phase-change memory cell and the program protection state corresponds to an amorphous state of a phase-change material in the phase-change memory cell.

* * * * *